United States Patent
Yamamoto et al.

(10) Patent No.: US 9,461,585 B2
(45) Date of Patent: *Oct. 4, 2016

(54) OSCILLATION CIRCUIT, OSCILLATOR, MANUFACTURING METHOD OF OSCILLATOR, ELECTRONIC DEVICE, AND MOVING OBJECT

(71) Applicant: Seiko Epson Corporation, Tokyo (JP)

(72) Inventors: Takehiro Yamamoto, Suwa (JP); Masayuki Ishikawa, Suwa (JP); Yosuke Itasaka, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/525,568

(22) Filed: Oct. 28, 2014

(65) Prior Publication Data

US 2015/0116048 A1 Apr. 30, 2015

(30) Foreign Application Priority Data

Oct. 30, 2013 (JP) .................................. 2013-225998

(51) Int. Cl.
H03B 5/36 (2006.01)

(52) U.S. Cl.
CPC .............. *H03B 5/366* (2013.01); *H03B 5/362* (2013.01); *H03B 2200/004* (2013.01); *H03B 2200/0008* (2013.01); *H03B 2200/0012* (2013.01); *H03B 2200/0034* (2013.01); *H03B 2200/0062* (2013.01)

(58) Field of Classification Search
CPC .................. H03B 5/366; H03B 5/362; H03B 2200/0012; H03B 2200/0062; H03B 2200/0034; H03B 2200/0008; H03B 2200/004

USPC .......... 331/116 R, 116 FE, 116 M, 158, 160, 331/36 C, 177 R, 177 V, 185

See application file for complete search history.

(56) References Cited

U.S. PATENT DOCUMENTS

| | | |
|---|---|---|
| 5,126,695 A | 6/1992 | Abe |
| 5,369,377 A | 11/1994 | Benhamida |
| 5,517,109 A | 5/1996 | Albean et al. |
| 6,617,756 B1 | 9/2003 | Uchiyama |
| 6,621,362 B2 | 9/2003 | Momtaz et al. |
| 6,782,485 B2 * | 8/2004 | Takai ........................ G06F 1/08 327/18 |
| 6,819,195 B1 * | 11/2004 | Blanchard ................ H03B 5/06 331/158 |
| 7,129,624 B2 | 10/2006 | Umeki et al. |
| 7,221,234 B2 | 5/2007 | Chien |
| 7,259,638 B2 | 8/2007 | Takahashi |

(Continued)

FOREIGN PATENT DOCUMENTS

| | | |
|---|---|---|
| JP | 02-261210 | 10/1990 |
| JP | 7-046072 A | 2/1995 |

(Continued)

*Primary Examiner* — Richard Tan
(74) *Attorney, Agent, or Firm* — Harness, Dickey & Pierce, P.L.C.

(57) ABSTRACT

An oscillation circuit includes: an oscillation unit which includes a first terminal and a second terminal connected to a vibrator; a third terminal to which a ground potential is supplied; a fourth terminal which is electrically connected to the second terminal, and to which at least one of an AC voltage for driving the vibrator and a voltage for operating the oscillation unit is applied; and a first switching unit which switches modes of electrical connection between the first terminal and the third terminal.

14 Claims, 10 Drawing Sheets

(56) References Cited

U.S. PATENT DOCUMENTS

| | | |
|---|---|---|
| 7,463,097 B2 | 12/2008 | Costa et al. |
| 7,471,164 B2 | 12/2008 | Reimann |
| 7,646,257 B2 | 1/2010 | Gailus et al. |
| 7,714,674 B2 | 5/2010 | Guo et al. |
| 7,768,357 B2 | 8/2010 | Yamakawa |
| 7,795,982 B2 * | 9/2010 | Yamamoto ............. H01L 24/49 310/318 |
| 7,821,348 B2 | 10/2010 | Ishimaru et al. |
| 7,978,016 B2 | 7/2011 | Naito |
| 8,031,025 B2 | 10/2011 | Wang et al. |
| 8,143,961 B2 | 3/2012 | Mastovich |
| 8,164,159 B1 | 4/2012 | Armstrong et al. |
| 8,253,506 B2 | 8/2012 | Liu et al. |
| 8,368,472 B2 * | 2/2013 | Nakamura ............. H03K 4/501 327/105 |
| 8,461,934 B1 | 6/2013 | Carnu et al. |
| 2002/0171499 A1 | 11/2002 | Momtaz et al. |
| 2003/0227341 A1 | 12/2003 | Sawada |
| 2004/0056725 A1 | 3/2004 | Kitamura et al. |
| 2006/0049878 A1 * | 3/2006 | Kawabe ............... H03C 3/0925 331/16 |
| 2007/0075798 A1 | 4/2007 | Amano |
| 2007/0132524 A1 | 6/2007 | Kishino |
| 2008/0001678 A1 | 1/2008 | Otsuka |
| 2008/0191756 A1 | 8/2008 | Li et al. |
| 2009/0039970 A1 | 2/2009 | Shen et al. |
| 2009/0115542 A1 | 5/2009 | Nakamura et al. |
| 2009/0256449 A1 | 10/2009 | Nishimura et al. |
| 2010/0171557 A1 | 7/2010 | Tsukizawa |
| 2012/0126907 A1 * | 5/2012 | Nakamoto ............... H03B 5/36 331/155 |
| 2012/0176763 A1 * | 7/2012 | Asamura ............... H03B 5/364 361/820 |
| 2013/0154754 A1 | 6/2013 | Frank |
| 2013/0257553 A1 | 10/2013 | Ishii |
| 2014/0132362 A1 | 5/2014 | Hsiao |
| 2014/0210565 A1 | 7/2014 | Vilas Boas et al. |
| 2015/0116044 A1 * | 4/2015 | Itasaka ................... H03B 5/366 331/62 |
| 2015/0116051 A1 | 4/2015 | Terrovitis |

FOREIGN PATENT DOCUMENTS

| | | |
|---|---|---|
| JP | 07-249957 | 9/1995 |
| JP | 11-284484 A | 10/1999 |
| JP | 2000-278079 A | 10/2000 |
| JP | 2001-007648 A | 1/2001 |
| JP | 2001-094347 A | 4/2001 |
| JP | 2001-102870 A | 4/2001 |
| JP | 2002-299991 A | 10/2002 |
| JP | 2004-120293 A | 4/2004 |
| JP | 2004-214799 A | 7/2004 |
| JP | 2004-328505 A | 11/2004 |
| JP | 2005-051513 A | 2/2005 |
| JP | 2005-203858 A | 7/2005 |
| JP | 2009-044606 A | 2/2009 |
| JP | 2009-164691 A | 7/2009 |
| JP | 2009-201097 A | 9/2009 |
| JP | 2009-253883 A | 10/2009 |
| JP | 2010-050508 A | 3/2010 |
| JP | 2010-062959 A | 3/2010 |
| JP | 2010-074840 A | 4/2010 |
| JP | 2013-098678 A | 5/2013 |
| JP | 2013-207337 A | 10/2013 |
| JP | 2014-154994 A | 8/2014 |

* cited by examiner

OSCILLATION CIRCUIT, OSCILLATOR, MANUFACTURING METHOD OF OSCILLATOR, ELECTRONIC DEVICE, AND MOVING OBJECT

BACKGROUND

1. Technical Field

The present invention relates to an oscillation circuit, an oscillator, a manufacturing method of an oscillator, an electronic device, and a moving object.

2. Related Art

From time to time it is necessary to inspect the characteristics of a vibrator such as a crystal vibrator (piezoelectric vibrator) or a vibrator having a micro electromechanical system (MEMS). To do this, overdrive inspection is performed by inspecting the frequency characteristics of the vibrator by applying an alternating current (AC) signal with high current, voltage, or power to drive the vibrator. Alternatively, drive level inspection may be performed by inspecting the fluctuation of frequency characteristics of the vibrator by applying a signal obtained by gradually increasing or decreasing a frequency of an AC signal with high current, voltage, or power to drive the vibrator.

Recently, however, an oscillator in which a crystal vibrator and an oscillation circuit are accommodated in the same accommodation container (housing) has been developed in order to provide a miniaturized oscillator. Accordingly, various investigations are needed in order to inspect the characteristics of the vibrator after mounting the crystal vibrator and the oscillation circuit in the same accommodation container.

JP-A-2001-102870 discloses a crystal oscillator that includes an analog switch which is controlled by applying a specified DC voltage to an inspecting terminal when inspecting characteristics of a crystal vibrator and a power input terminal. In this oscillator, the crystal vibrator is electrically connected to the inspecting terminal through an analog switch when inspecting the crystal vibrator. On the other hand, the inspecting terminal is separated from the crystal vibrator when normally operating the oscillator.

JP-A-2009-201097 discloses a crystal oscillator which uses a function terminal of the oscillator as an inspecting terminal of a crystal vibrator.

That is, in JP-A-2009-201097, an output terminal and a standby terminal are selected as terminals to be used with the inspecting terminal of the crystal vibrator. This is because a switching circuit is controlled with a power supply voltage when inspecting the characteristics of the crystal vibrator.

To stabilize an operation of the switching circuit, however, it is necessary to apply a potential with high stability to a power supply terminal and a ground terminal. If such terminals are used as the crystal inspection terminal, a signal of the crystal vibrator may be superposed with a DC voltage, and accordingly the power supply voltage may be unstable. Therefore, the two terminals of the crystal vibrator are limited to the output terminal and the standby terminal.

In both JP-A-2001-102870 and JP-A-2009-201097, when inspection of the vibrator is performed, the power supply terminal and the ground terminal are necessary for controlling the analog switch and the switching circuit. In addition, two crystal inspection terminals which are connected to the vibrator are used for the inspection. As such, it is necessary to manage the connection of electrodes and probes electrically connected to the four terminals. Since there are a great number of connection portions to be managed, the likelihood of an inspection malfunction due to a connection failure increases, and the reliability of the inspection may be decreased.

SUMMARY

An advantage of some aspects of the invention is to provide an oscillation circuit, an oscillator, a manufacturing method of an oscillator, an electronic device, and a moving object which can increase the reliability of the inspection of a vibrator.

Application Example 1

This application example is directed to an oscillation circuit including: an oscillation unit which includes a first terminal and a second terminal connected to a vibrator; a third terminal which is connected to a predetermined potential; a fourth terminal which is electrically connected to the second terminal; and a first switching unit which switches modes of electrical connection between the first terminal and the third terminal, in which the fourth terminal is a terminal to which at least one of an AC voltage for driving the vibrator and a voltage for operating the oscillation unit is applied.

According to this application example, it is possible to perform the inspection of the characteristics of the vibrator such as the overdrive inspection or the drive level inspection, by supplying the AC voltage for driving the vibrator between the third terminal electrically connected to the first terminal and the fourth terminal electrically connected to the second terminal. At the time of the normal operation of the oscillation circuit and the inspection of the vibrator, the third terminal and the fourth terminal are commonly used, and accordingly it is possible to reduce the number of terminals used in the inspection, compared to a case of providing an inspecting terminal dedicated to the inspection. Thus, it is possible to reduce the possibility of an inspection malfunction due to a failure in the electrical connection between a probe for inputting an inspecting signal and a terminal on the oscillation circuit side, and therefore, it is possible to realize the oscillation circuit with improved reliability in the inspection of the vibrator. In addition, it is possible to supply an AC voltage for inspecting the characteristics of the vibrator to the vibrator through the third terminal and the fourth terminal, not using the oscillation unit, and accordingly, a limitation regarding a magnitude of the AC voltage for inspecting the vibrator is reduced, compared to a case of supplying the AC voltage for inspecting the vibrator to the vibrator through the oscillation unit. Since the terminal dedicated to the inspection is commonly used with the terminal used at the time of the normal operation, it is possible to reduce the number of terminals and to miniaturize the oscillation circuit.

Application Example 2

In the oscillation circuit according to the application example described above, it is preferable that the predetermined voltage is a ground voltage.

According to this application example, since the third terminal is a terminal connected to the ground voltage, it is possible to apply the AC voltage for inspecting the vibrator to the vibrator in a more stable state, when the AC voltage for inspecting the vibrator is supplied between the third terminal electrically connected to the first terminal and the fourth terminal electrically connected to the second terminal.

Application Example 3

In the oscillation circuit according to the application example described above, it is preferable that the first switching unit is a circuit including a function of protecting the oscillation unit from a voltage higher than a maximum voltage applied to the first terminal in a state where the oscillation unit is operated.

According to this application example, since the first switching unit can be commonly used with the circuit having a function of protecting the oscillation unit from the voltage higher than a maximum voltage applied to the first terminal in a state where the oscillation unit is operated, for example, static electricity, it is possible to reduce a circuit size, compared to a case of separately providing a dedicated switch as the first switching unit and a circuit for static electricity protection. Therefore, it is possible to realize an oscillation circuit which can be miniaturized.

Application Example 4

In the oscillation circuit according to the application example described above, it is preferable that the first terminal is an input terminal of the oscillation unit.

According to this application example, since the input terminal of the oscillation unit is connected to the ground potential side, it is easy to stop the operation of the oscillation unit at the time of inspection of the vibrator. Accordingly, since the magnitude of the voltage which is generated from the oscillation unit at the time of inspection of the vibrator and applied to the vibrator is reduced, it is possible to realize an oscillation circuit with improved reliability in the inspection of the vibrator. It is possible to realize an oscillation circuit with less concern regarding degradation of the oscillation unit, even when the AC voltage for inspecting the vibrator is applied.

Application Example 5

In the oscillation circuit according to the application example described above, it is preferable that the first switching unit includes a transistor.

According to this application example, it is possible to easily control the electrical connection between the first terminal and the third terminal by using the transistor as a switch circuit, for example. In addition, it is possible to perform the inspection of the vibrator by using three terminals of the third terminal, a terminal for supplying the power supply potential for operating the transistor, and the fourth terminal. Thus, it is possible to reduce the possibility of an inspection malfunction due to a failure in the electrical connection between the first terminal and the third terminal and to inspect the vibrator with the small number of terminals, and therefore, it is possible to realize an oscillation circuit with improved reliability in the inspection of the vibrator.

Application Example 6

In the oscillation circuit according to the application example described above, it is preferable that the fourth terminal is not any one of a terminal to which a power supply potential is supplied and a terminal to which an oscillation signal of the oscillation circuit is output.

According to this application example, since the fourth terminal is not the terminal to which the power supply potential is supplied, it is possible to perform the inspection of the vibrator without being affected by noise due to fluctuation of the power potential at the time of the inspection of the vibrator. In addition, since the fourth terminal is not the terminal to which a transmission signal of the oscillation circuit is output, the terminal to which a transmission signal of the oscillation circuit is output and the vibrator are not connected to each other in an electrical circuit manner. Accordingly, it is possible to weaken electrical coupling between the fourth terminal and the terminal to which an oscillation signal of the oscillation circuit is output, that is, to maintain the electrical coupling at a high impedance, and therefore it is possible to reduce malfunction at the time of normal operation of the oscillation circuit.

Application Example 7

In the oscillation circuit according to the application example described above, it is preferable that the oscillation circuit further includes a control unit which controls the first switching unit, the first switching unit includes a first mode in which the first terminal and the third terminal are controlled to be electrically connected to each other, and a second mode in which the first terminal and the third terminal are controlled so as not to be electrically connected to each other, and the control unit switches the first switching unit from the second mode to the first mode, based on a clock signal input in a period in which the supplied power potential is equal to or greater than a reference value.

According to this application example, since the control unit performs switching of the mode based on the two signals of the magnitude of the power potential and the clock signals, the mode is not switched by only the fluctuation of the power potential, and accordingly, it is possible to reduce the possibility of the malfunction of unintentionally switching the mode.

Application Example 8

In the oscillation circuit according to the application example described above, it is preferable that the oscillation circuit further includes a second switching unit which switches modes of electrical connection between the second terminal and the fourth terminal.

According to this application example, as the terminal for inspection when inspecting the vibrator, the fourth terminal can be commonly used as a function terminal (for example, a terminal which receives input of the control signal for controlling the oscillation frequency) at the time of the normal operation of the oscillation circuit, and accordingly it is possible to reduce the number of terminals used in the inspection, compared to a case of providing the inspection terminal dedicated to the inspection. Thus, it is possible to reduce a possibility of occurrence of malfunction of the inspection due to a failure in electrical connection between a probe for inputting an inspecting signal and a terminal on the oscillation circuit side, and therefore, it is possible to realize the oscillation circuit with improved reliability in the inspection of the vibrator.

Application Example 9

In the oscillation circuit according to the application example described above, it is preferable that the oscillation circuit further includes a second switching unit which switches modes of electrical connection between the second terminal and the fourth terminal; and a control unit which controls the first switching unit and the second switching unit, the first switching unit and the second switching unit include a first mode in which the first terminal and the third terminal are controlled to be electrically connected to each other and the second terminal and the fourth terminal are controlled to be electrically connected to each other, and a second mode in which the first terminal and the third terminal are controlled so as not to be electrically connected to each other and the second terminal and the fourth terminal are controlled so as not to be electrically connected to each other, and the control unit switches the mode of the first switching unit and the second switching unit from the second mode to the first mode, based on a clock signal input in a period in which the supplied power potential is equal to or greater than a reference value.

According to this application example, since the control unit performs switching of the mode based on the two signals of the magnitude of the power potential and the clock signal, the mode is not switched by only the fluctuation of the power potential, and accordingly, it is possible to reduce the possibility of the malfunction of unintentionally switching the mode.

Application Example 10

This application example is directed to an oscillation circuit including: an oscillation section which uses a vibrator as a frequency source and includes a feedback conduction path between the vibrator and the oscillation section; a path through which a signal passes from the oscillation section to the vibrator; a path through which a signal passes from the vibrator to the oscillation section; and an impedance control section which controls an impedance between the path through which a signal passes from the vibrator to the oscillation section and a ground conduction path, in which the path through which a signal passes from the oscillation section to the vibrator is a path to which an AC voltage for driving the vibrator is applied.

According to this application example, by supplying a AC voltage for driving the vibrator, for example, the AC voltage for inspecting characteristics of the vibrator between the path through which a signal passes from the oscillation section to the vibrator and the ground conduction path, and by controlling an impedance between the path through which a signal passes from the vibrator to the oscillation section and the ground conduction path to be decreased by the impedance control section, it is possible to perform inspection of the characteristics of the vibrator such as the overdrive inspection and drive level inspection. At the time of the normal operation of the oscillation circuit and the inspection of the vibrator, the terminal to which an AC voltage for inspection is applied and the ground conduction path can be commonly used, and accordingly it is possible to reduce the number of terminals used in the inspection, compared to a case of providing an inspecting terminal dedicated to the inspection, for example. Thus, it is possible to reduce a possibility of occurrence of malfunction of the inspection due to a failure in electrical connection between a probe for inputting an inspecting the AC voltage and a terminal on the oscillation circuit side, and therefore, it is possible to realize the oscillation circuit with improved reliability in the inspection of the vibrator. In addition, it is possible to supply an AC voltage for inspecting the characteristics of the vibrator to the vibrator through the path through which a signal passes from the oscillation section to the vibrator and the ground conduction path, not using the oscillation section, and accordingly, a limitation regarding the magnitude of the AC voltage for inspecting the characteristics of the vibrator is reduced, compared to a case of supplying the AC voltage for inspecting the characteristics of the vibrator to the vibrator through the oscillation section. It is possible to realize an oscillation circuit with less concern regarding degradation of the oscillation unit, even when the AC voltage for inspecting the characteristics of the vibrator is applied.

Application Example 11

This application example is directed to an oscillator including: any of the oscillation circuits described above; and a vibrator.

Application Example 12

In the oscillator according to the application example described above, it is preferable that oscillator further includes a package which accommodates the oscillation circuit and the vibrator.

According to this application example, since the oscillation circuit with improved reliability in the inspection of the vibrator is included, and therefore it is possible to realize an oscillator with improved reliability in the inspection of the vibrator.

Application Example 13

This application example is directed to a manufacturing method of an oscillator including: preparing a configuration of including an oscillation circuit including an oscillation unit which includes a first terminal and a second terminal connected to a vibrator, a third terminal which is connected to a predetermined potential, a fourth terminal which is electrically connected to the second terminal, and a first switching unit which switches modes of electrical connection between the first terminal and the third terminal, and a vibrator, in which the oscillation circuit and the vibrator are electrically connected to each other, and the first switching unit is switched so as to electrically connect the first terminal and the third terminal to each other; applying an AC voltage to the third terminal and the fourth terminal; and switching the first switching unit so as not to electrically connect the first terminal and the third terminal to each other.

According to this application example, by supplying the AC voltage for inspecting the vibrator between the third terminal and the fourth terminal, it is possible to perform the inspection of the characteristics of the vibrator such as overdrive inspection or drive level inspection. At the time of the normal operation of the oscillation circuit and the inspection of the vibrator, the third terminal can be commonly used, and accordingly it is possible to reduce the number of terminals used in the inspection, compared to a case of providing an inspecting terminal dedicated to the inspection. Thus, it is possible to reduce the possibility of an inspection malfunction due to a failure in the electrical connection between a probe for inputting an inspecting signal and a terminal on the oscillation circuit side, and therefore, it is possible to realize a manufacturing method of an oscillator with improved reliability in the inspection of the vibrator. When the third terminal is a terminal connected to the ground potential, for example, it is possible to supply the ground potential as a reference of the AC voltage for vibrator inspection and the ground potential of the oscillation circuit to the commonly-used third terminal. Therefore, it is possible to further reduce the number of terminals used in the inspection.

Application Example 14

In the manufacturing method of an oscillator according to the application example described above, it is preferable that the AC voltage applied to the third terminal and the fourth terminal is at least one of a voltage for overdrive inspection and a voltage for drive level inspection.

According to this application example, since at least one of the overdrive inspection and the drive level inspection is performed as the inspection of the vibrator, it is possible to determine that the oscillator confirmed as a good product in the inspection of the vibrator, is a good product. Therefore, it is possible to manufacture the oscillator with high reliability.

Application Example 15

This application example is directed to an electronic device including any of the oscillation circuits described above, or any of the oscillators described above.

Application Example 16

This application example is directed to a moving object including any of the oscillation circuits described above, or any of the oscillators described above.

According to this application example, since the oscillation circuit or the oscillator with improved reliability in the inspection of the vibrator is included, it is possible to realize an electronic device and a moving object with high reliability.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferable embodiments of the invention will be described in detail with reference to the drawings. The accompanying drawings are provided for convenience of description. The examples which will be described later do not limit the scope of the invention. The entirety of the configurations which will be described later are not necessarily essential constituent elements of the invention.

1. Oscillation Circuit According to First Embodiment

Figure 1:
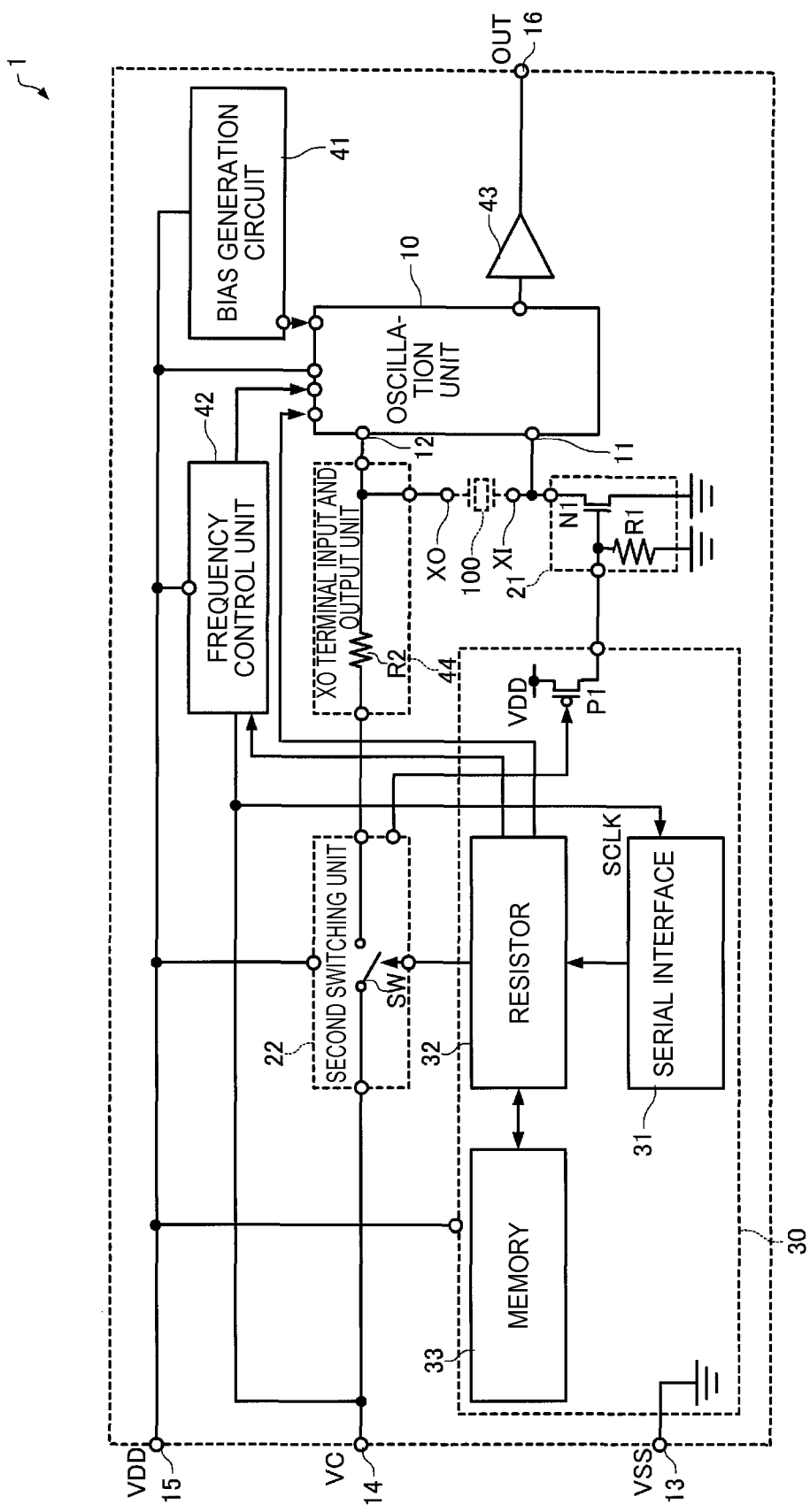
FIG. 1 is a circuit diagram of an oscillation circuit according to a first embodiment.

FIG. 1 is a circuit diagram of an oscillation circuit 1 according to a first embodiment. A part or an entirety of the oscillation circuit 1 may be configured with a semiconductor device.

The oscillation circuit 1 according to the embodiment includes an oscillation section which uses a vibrator 100 as a frequency source and includes a feedback conduction path between the vibrator 100 and the oscillation section, a path through which a signal passes from the oscillation section to the vibrator 100, a path through which a signal passes from the vibrator 100 to the oscillation section, and an impedance control section which controls an impedance between the path through which a signal passes from the vibrator 100 to the oscillation section and a ground conduction path. The oscillation circuit 1 according to the first embodiment as an example of the invention has a configuration of not including the vibrator 100, but the vibrator 100 may be included in the oscillation circuit 1.

More specifically, the oscillation circuit 1 includes an oscillation unit 10 which includes a first terminal 11 and a second terminal 12 connected to the vibrator 100, a third terminal 13 to which a ground potential VSS (one example of a predetermined potential) is supplied, a fourth terminal 14 which is electrically connected to the second terminal 12, and a first switching unit 21 which switches modes of electrical connection between the first terminal 11 and the third terminal 13. The functions of the oscillation section described above are mainly realized by the oscillation unit 10. A part of the path through which a signal passes from the oscillation section to the vibrator 100 is a portion where the second terminal 12 and an XO terminal input and output unit 44 are electrically connected to each other. A part of the path through which a signal passes from the vibrator 100 to the oscillation section is a portion where the first terminal 11 and the first switching unit 21 are electrically connected to each other. The impedance control section described above is mainly realized by the first terminal 11 and the first switching unit 21. In the example shown in FIG. 1, the oscillation circuit 1 further includes a control unit 30 which controls the first switching unit 21 and a second switching unit 22, the XO terminal input and output unit 44, a fifth terminal 15 to which a power potential VDD is supplied, and a sixth terminal 16 which outputs an oscillation signal.

The oscillation unit 10 is electrically connected to the vibrator 100 and performs an oscillation operation. As the oscillation unit 10, various well-known oscillation circuits such as a pierce oscillation circuit, an inverter-type oscillation circuit, a Colpitts oscillation circuit, and a Hartley oscillation circuit can be used. In the embodiment, the oscillation unit 10 is a pierce oscillation circuit. In the embodiment, the oscillation unit 10 is configured with a bias generation circuit 41, a frequency control unit 42, and an output buffer 43.

Figure 2:
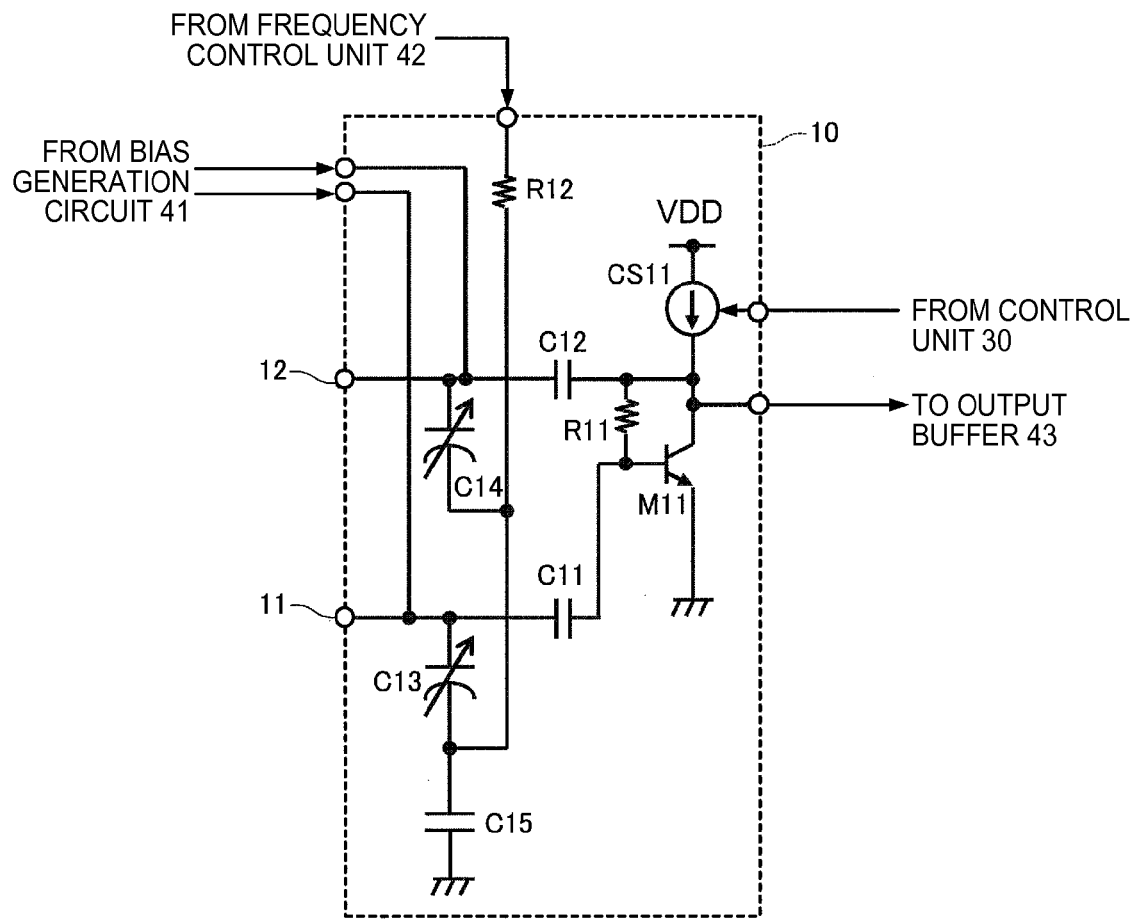
FIG. 2 is a circuit diagram showing an example of a configuration of an oscillation unit.

FIG. 2 is a circuit diagram showing an example of a configuration of the oscillation unit 10. In the example shown in FIG. 2, the oscillation unit 10 includes a transistor M11, capacitors C11 to C15, resistors R11 to R12, and a current source CS11. The capacitor C11 and the capacitor C12 are DC cut capacitances. The capacitor C13 and the capacitor C14 are variable capacitances for frequency controlling. By providing the capacitor C11 and the capacitor C12, it is possible to control a bias voltage applied to the capacitor C13 and the capacitor C14 to be separated from the transistor M11 and the like. In addition, when performing inspection of characteristics of the vibrator 100 such as overdrive inspection or drive level inspection, it is possible to reduce a risk of a through current flowing into the transistor M11.

The first terminal 11 and a base of the transistor M11 are connected to each other through the capacitor C11. The second terminal 12 and a collector of the transistor M11 are connected to each other through the capacitor C12. The base and the collector of the transistor M11 are connected to each other through the resistor R11. The collector of the transistor M11 and the power potential VDD are connected to each other through the current source CS11. The collector of the transistor M11 is connected to an input terminal of the output buffer 43. An emitter of the transistor M11 is connected to the ground potential VSS. The capacitor C13 and the capacitor C15 are connected in series, with one end of the capacitor C13 connected to the first terminal 11, and one end of the capacitor C15 connected to the ground potential VSS. One end of the capacitor C14 is connected to the second terminal 12. The other end of the capacitor C14 is connected to a common connection portion of the capacitor C13 and the capacitor C15, and is connected to an output terminal of the frequency control unit 42 through the resistor R12. A bias voltage output by the bias generation circuit 41 is supplied to one end of the capacitor C13 and one end of the capacitor C14.

Figure 3:
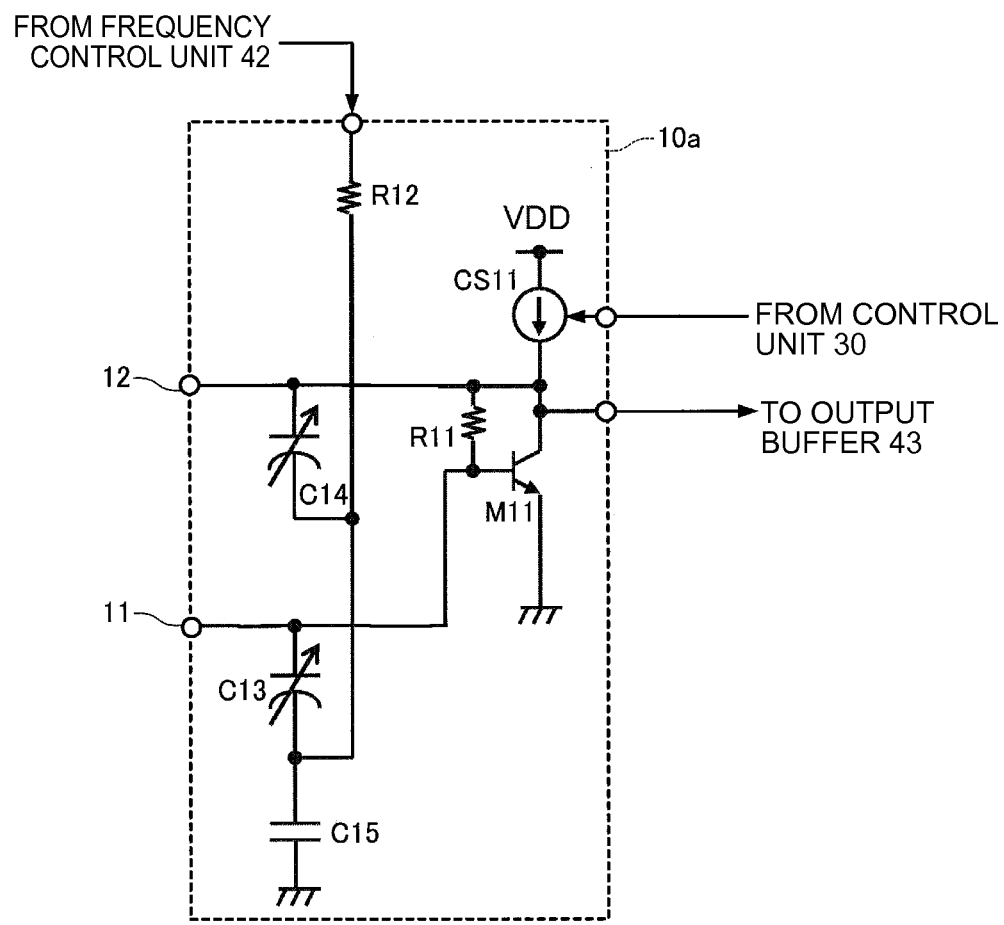
FIG. 3 is a circuit diagram showing an example of a configuration of an oscillation unit which is a modification example of an oscillation unit of FIG. 2.

FIG. 3 is a circuit diagram showing an example of a configuration of an oscillation unit 10a which is a modification example of the oscillation unit 10. The oscillation unit 10a has a configuration of the oscillation unit 10 excluding the capacitor C11 and the capacitor C12 which are DC cut capacitances. Accordingly, a configuration of receiving a bias voltage from the bias generation circuit 41 is also excluded. The other configurations are the same as those of the oscillation unit 10.

In the oscillation unit 10 shown in FIG. 2 and the oscillation unit 10a shown in FIG. 3, an input terminal side is set as the first terminal 11 and an output terminal side is set as the second terminal 12, but an input terminal side can be set as the second terminal 12 and an output terminal side can be set as the first terminal 11.

Returning to FIG. 1, the bias generation circuit 41 generates a bias voltage and supplies the bias voltage to the oscillation unit 10, based on power supplied from the fifth terminal 15. In the embodiment, the bias voltage is supplied to the capacitor C13 and the capacitor C14 of the oscillation unit 10.

The frequency control unit 42 controls variable capacitances (capacitor C13 and the capacitor C14 of FIG. 2) included in the oscillation unit 10 based on a control signal input to the fourth terminal 14. That is, in the example shown in FIG. 1, the fourth terminal 14 also functions as a terminal for frequency controlling. Accordingly, it is possible to control an oscillation frequency of the oscillation unit 10. The frequency control unit 42 may include an amplification circuit which amplifies a control signal input to the fourth terminal 14 and outputs the control signal to the oscillation unit 10.

The output buffer 43 is configured with the amplification circuit. The oscillation signal output by the oscillation unit 10 is input to the output buffer 43, and the output buffer outputs the signal to the sixth terminal 16.

The first switching unit 21 switches modes of electrical connection between the first terminal 11 of the oscillation unit 10 and the third terminal 13 to which the ground potential VSS is supplied. In the example shown in FIG. 1, the first switching unit 21 switches modes of electrical connection between the first terminal 11 and the third terminal 13 based on the control signal output by the control unit 30. The first switching unit 21, for example, includes a switch connected between the first terminal 11 and the third terminal 13. In the example shown in FIG. 1, an NMOS transistor N1 functions as the switch.

In the example shown in FIG. 1, the second terminal 12 and the fourth terminal 14 are electrically connected to each other through the XO terminal input and output unit 44 and the second switching unit 22. The XO terminal input and output unit 44 connects the second terminal 12 of the oscillation unit 10 and the vibrator 100 to each other, and connects the second terminal 12 and the second switching unit 22 to each other through the resistor R2. The resistor R2 functions as an electro-static discharge (ESD) protection element with respect to the second switching unit 22.

According to the oscillation circuit 1 of the embodiment, by supplying a voltage signal (one example of an AC voltage for driving the vibrator 100) for inspecting characteristics of the vibrator 100 between the path through which a signal passes from the oscillation section to the vibrator 100 and the ground conduction path, and by controlling an impedance between the path through which a signal passes from the vibrator 100 to the oscillation section and the ground conduction path to be decreased by the impedance control section, it is possible to perform inspection of the characteristics of the vibrator 100 such as the overdrive inspection (test of applying an alternating current (AC) signal to perform strong excitation of the vibrator 100), drive level inspection (frequency stability test of the vibrator 100 when inputting the AC signal while changing amplitude), or frequency adjustment of the vibrator 100 (performing adjustment of the vibrator 100 by measuring a resonance frequency of the vibrator 100 and setting the measured resonance frequency to a desired resonance frequency). At the time of the normal operation of the oscillation circuit 1 and the inspection of the vibrator 100, the terminal to which a voltage for inspection is applied and the ground conduction path can be commonly used, and accordingly it is possible to reduce the number of terminals used in the inspection, compared to a case of providing an inspecting terminal dedicated to the inspection, for example. Thus, it is possible to reduce the possibility of an inspection malfunction due to a failure in the electrical connection between a probe for inputting an inspecting signal and a terminal on the oscillation circuit 1 side, and therefore, it is possible to realize the oscillation circuit 1 with improved reliability in the inspection of the vibrator 100. In addition, it is possible to supply a voltage signal for inspecting the characteristics of the vibrator 100 to the vibrator 100 through the path through which a signal passes from the oscillation section to the vibrator and the ground conduction path, not using the oscillation section, and accordingly, a limitation regarding a magnitude of the voltage signal is reduced, compared to a case of supplying the voltage signal to the vibrator 100 through the oscillation section. It is possible to realize the oscillation circuit 1 with less concern regarding degradation of the oscillation unit 10, even when an inspection signal of the vibrator 100 is applied.

More specifically, according to the oscillation circuit 1 of the embodiment, it is possible to perform the inspection of the characteristics of the vibrator 100 such as the overdrive inspection or the drive level inspection, for example, by supplying the voltage signal (one example of AC voltage for driving the vibrator 100) for inspecting the vibrator 100 between the third terminal 13 electrically connected to the first terminal 11 and the fourth terminal 14 electrically connected to the second terminal 12, for example. At the time of the normal operation of the oscillation circuit 1 and the inspection of the vibrator 100, the third terminal 13 and the fourth terminal 14 are commonly used, and accordingly it is possible to reduce the number of terminals used in the inspection, compared to a case of providing an inspecting terminal dedicated to the inspection. Thus, it is possible to reduce the possibility of an inspection malfunction due to a failure in the electrical connection between a probe for inputting an inspecting signal and a terminal on the oscillation circuit 1 side, and therefore, it is possible to realize the oscillation circuit 1 with improved reliability in the inspection of the vibrator. In addition, it is possible to supply a voltage signal for inspecting the characteristics of the vibrator 100 to the vibrator 100 through the third terminal 13 and the fourth terminal 14, not using the oscillation unit 10, and accordingly, a limitation regarding a magnitude of the voltage signal is reduced, compared to a case of supplying the voltage signal to the vibrator 100 through the oscillation unit 10. Since the terminal dedicated to the inspection is commonly used with the terminal used at the time of the normal operation, it is possible to reduce the number of terminals and to miniaturize the oscillation circuit 1.

As shown in FIG. 1, the oscillation circuit 1 may further include the second switching unit 22 which switches modes of electrical connection between the second terminal 12 and the fourth terminal 14.

The second switching unit 22 includes a switch SW which switches modes of electrical connection between the second terminal 12 and the fourth terminal 14. The switch SW switches modes of electrical connection between the second terminal 12 and the fourth terminal 14, based on the control signal output by the control unit 30. The switch SW may be configured with the transistor.

According to the oscillation circuit 1 of the embodiment, as the terminal for inspection when inspecting the vibrator 100, the fourth terminal 14 can be used as a function terminal (for example, a terminal which receives input of the control signal for controlling the oscillation frequency) at the time of the normal operation of the oscillation circuit 1, and accordingly it is possible to reduce the number of terminals used in the inspection, compared to a case of providing the inspection terminal dedicated to the inspection. Thus, it is possible to reduce the possibility of an inspection malfunction due to a failure in the electrical connection between a probe for inputting an inspecting signal and a terminal on the oscillation circuit side, and therefore, it is possible to realize the oscillation circuit 1 with improved reliability in the inspection of the vibrator 100.

As shown in FIG. 1, the first switching unit 21 may be a circuit (electrostatic discharge protection circuit, which is one example of a circuit which protects the oscillation unit 10 from a voltage higher than the maximum voltage applied to the first terminal 11 in a state where the oscillation unit 10 is operated) having a function of protecting the oscillation unit 10 from static electricity. In the example shown in FIG. 1, the first switching unit 21 includes the NMOS transistor N1 which is an example of the transistor and the resistor R1, and functions as an electrostatic discharge protection circuit with respect to the oscillation unit 10 or the vibrator 100 on the first terminal 11 side.

A drain of the NMOS transistor N1 is connected to the first terminal 11 and a source thereof is connected to the ground potential VSS. One end of the resistor R1 is connected to a gate of the NMOS transistor N1 and the other end thereof is connected to the ground potential VSS. The control signal from the control unit 30 is input to the gate of the NMOS transistor N1, and the NMOS transistor N1 switches between an ON state and an OFF state based on the input control signal.

According to the oscillation circuit 1 of the embodiment, since the first switching unit 21 is an electrostatic discharge protection circuit, it is possible to reduce a circuit size, compared to a case of providing a dedicated switch as the first switching unit 21. Therefore, it is possible to realize the oscillation circuit 1 which can be miniaturized.

As the first switching unit 21, a plurality of electrostatic discharge protection circuits may be connected between the first terminal 11 and the ground potential VSS. When the plurality of first switching units 21 of the embodiment are connected in parallel, it is possible to further improve a function of discharging static electricity of the first switching units 21, and to increase the number of paths of the voltage signal for inspection applied to the vibrator 100 to the ground potential VSS. Therefore, it is possible to reduce the magnitude of the voltage signal for inspection flowing to one of the first switching units 21, compared to a case of including only one first switching unit 21, and accordingly a possibility of damaging the first switching unit 21 is reduced, and a limitation regarding a magnitude of the voltage signal for inspection is reduced.

Figure 4:
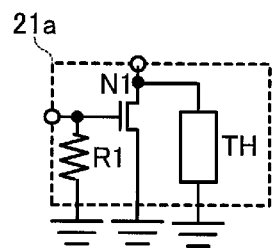
FIG. 4 is a circuit diagram showing a circuit configuration of a first switching unit which is a modification of a first switching unit of FIG. 1.

FIG. 4 is a circuit diagram showing a circuit configuration of a first switching unit 21a which is a modification of the first switching unit 21. The first switching unit 21a shown in FIG. 4 may be configured with a circuit including the NMOS transistor N1 and the resistor R1, and an element (electro static discharge protection element) TH having a function of protecting the oscillation unit 10 from static electricity, for example, a thyristor or a diode. with the configuration described above, it is possible to easily control the electrical connection between the first terminal 11 and the third terminal 13 to which the ground potential VSS is applied by using the NMOS transistor N1 as a switching circuit at the time of inspection of the vibrator 100, and to further improve durability of the oscillation unit 10 with respect to the static electricity in a case of operating the oscillation unit as an oscillator, and therefore it is possible to realize the oscillation circuit 1 with higher reliability.

As shown in FIGS. 1 and 2, the first terminal 11 may be an input terminal of the oscillation unit 10. In addition, as shown in FIGS. 1 and 2, the second terminal 12 may be an output terminal of the oscillation unit 10.

According to the oscillation circuit 1 of the embodiment, since the input terminal of the oscillation unit 10 is connected to the ground potential side, for example, it is easy to stop the operation of the oscillation unit 10 at the time of inspection of the vibrator 100. Accordingly, since the magnitude of the signal which is generated from the oscillation unit 10 at the time of inspection of the vibrator 100 and is applied to the vibrator 100 is reduced, it is possible to realize the oscillation circuit 1 with improved reliability in the inspection of the vibrator 100. It is possible to realize the oscillation circuit 1 with less concern regarding degradation of the oscillation unit 10, even when an inspection signal of the vibrator 100 is applied.

As shown in FIG. 1, the first switching unit 21 may include a transistor. In the example shown in FIG. 1, the first switching unit 21 includes the NMOS transistor N1.

According to the oscillation circuit 1 of the embodiment, it is possible to easily control the electrical connection between the first terminal 11 and the third terminal 13 to which the ground potential VSS is supplied by using the NMOS transistor N1 as a switching circuit, for example. In addition, it is possible to inspect the vibrator 100 by using three terminals of the third terminal 13 to which the ground potential VSS is supplied, the fifth terminal 15 for supplying the power potential VDD for operating the NMOS transistor N1, and the fourth terminal 14. Thus, it is possible to reduce the possibility of an inspection malfunction due to a failure in the electrical connection between the first terminal 11 and the third terminal 13 and to inspect the vibrator 100 with the small number of terminals, and therefore, it is possible to realize the oscillation circuit 1 with improved reliability in the inspection of the vibrator 100.

As shown in FIG. 1, the fourth terminal 14 is preferably a terminal which is neither a terminal to which the power potential VDD is supplied (fifth terminal 15), the terminal to which the ground potential VSS is supplied (third terminal 13), nor the terminal to which a transmission signal of the oscillation circuit 1 is output (sixth terminal 16; transmission signal output terminal).

Since the fourth terminal 14 is a terminal which is not the terminal to which the power potential VDD is supplied (fifth terminal 15), it is possible to perform the inspection of the vibrator 100 without being affected by noise due to fluctuation of the power potential VDD at the time of the inspection of the vibrator 100. In addition, since the fourth terminal 14 is a terminal which is not the terminal to which the ground potential VSS is supplied (third terminal 13), it is possible to supply the voltage signal for inspection of the vibrator 100 between the third terminal 13 and the fourth terminal 14 at the time of inspection of the vibrator 100. Further, since the fourth terminal 14 is a terminal which is not the terminal to which a transmission signal of the oscillation circuit 1 is output (sixth terminal 16), the terminal to which a transmission signal of the oscillation circuit 1 is output (sixth terminal 16) and the vibrator 100 are not connected to each other by an electrical circuit. Accordingly, it is possible to weaken the electrical coupling between the fourth terminal 14 and the terminal to which a transmission signal of the oscillation circuit 1 is output (sixth terminal 16), that is, to maintain the electrical coupling at a high impedance, and therefore it is possible to reduce malfunction at the time of normal operation of the oscillation circuit 1.

As shown in FIG. 1, the oscillation circuit 1 may further include the control unit 30 which controls the first switching unit 21, the first switching unit 21 may include a first mode in which the first terminal 11 and the third terminal 13 are controlled to be electrically connected to each other, and a second mode in which the first terminal 11 and the third terminal 13 are controlled so as not to be electrically connected to each other, and the control unit 30 may switch the first switching unit 21 from the second mode to the first mode, based on a clock signal SCLK input in a period in which the supplied power potential VDD is equal to or greater than a reference value Vt.

In addition, the oscillation circuit 1 may further include the second switching unit 22 which switches modes of electrical connection between the second terminal 12 and the fourth terminal 14, and the control unit 30 which controls the first switching unit 21 and the second switching unit 22, the first switching unit 21 and the second switching unit 22 may include a first mode in which the first terminal 11 and the third terminal 13 are controlled to be electrically connected to each other and the second terminal 12 and the fourth terminal 14 are controlled to be electrically connected to each other, and a second mode in which the first terminal 11 and the third terminal 13 are controlled so as not to be electrically connected to each other and the second terminal 12 and the fourth terminal 14 are controlled so as not to be electrically connected to each other, and the control unit 30 may switch the mode of the first switching unit 21 and the second switching unit 22 from the second mode to the first mode, based on the clock signal SCLK input in a period in which the supplied power potential VDD is equal to or greater than the reference value Vt.

In the example shown in FIG. 1, the control unit 30 includes a serial interface 31, a resistor 32, a memory 33, and a PMOS transistor P1.

The serial interface 31 receives the power potential VDD and input of the clock signal SCLK, and controls the resistor 32 and the memory 33 based on the input clock signal SCLK. In the embodiment, the clock signal SCLK is input from the fourth terminal 14. In the embodiment, the serial interface 31 includes a resistor writing mode in which data is written in the resistor 32, and a memory writing mode in which data is written in the resistor 32 and the memory 33.

The resistor 32 stores data for controlling the first switching unit 21, the second switching unit 22, the frequency control unit 42, and the oscillation unit 10, and controls the first switching unit 21, the second switching unit 22, the frequency control unit 42, and the oscillation unit 10 based on the stored data. When applying an electrical current to the oscillation circuit 1, the resistor 32 writes and stores the data stored in the memory 33, and stores new data written by the serial interface 31 when new data is written by the serial interface 31.

The memory 33 stores data stored in the resistor 32 when applying an electrical current to the oscillation circuit 1. The memory 33 may, for example, be configured with various examples of well-known nonvolatile memory such as a rewritable nonvolatile memory including an electrically erasable programmable read-only memory (EEPROM) or a flash memory, a floating gate avalanche injection metal oxide semiconductor (FAMOS) memory which is not electrically rewritable but erasable by emitting an ultraviolet ray, or a non-rewritable nonvolatile memory such as a mask read-only memory (ROM). The FAMOS memory has a system of accumulating a charge on a floating gate by avalanche implantation, and this kind of memory is a nonvolatile memory used as a one-time programmable memory (OTP).

A drain of the PMOS transistor P1 is connected to the power potential VDD, a source thereof is connected to the gate of the NMOS transistor N1 of the first switching unit 21, and the control signal output by the resistor 32 is input to a gate thereof through the second switching unit 22. The PMOS transistor P1 outputs the control signal to the gate of the NMOS transistor N1 of the first switching unit 21. In the example shown in FIG. 1, the control signal output by the resistor 32 is received by the gate through the second switching unit 22, but the control signal output by the resistor 32 may be directly received by the gate.

In the first mode, the control unit 30 controls the first switching unit 21 so as to set an electrical connection state between the first terminal 11 and the third terminal 13 to the ON state. In addition, in the first mode, the control unit 30 controls the second switching unit 22 so as to set an electrical connection state between the second terminal 12 and the fourth terminal 14 to the ON state. Further, in the first mode, the control unit 30 controls the frequency control unit 42 so as to stop an operation of the frequency control unit 42.

In the second mode, the control unit 30 controls the first switching unit 21 so as to set an electrical connection state between the first terminal 11 and the third terminal 13 to the OFF state. In addition, in the second mode, the control unit 30 controls the second switching unit 22 so as to set an electrical connection state between the second terminal 12 and the fourth terminal 14 to the OFF state. Further, in the second mode, the control unit 30 controls the frequency control unit 42 so as to cause the normal operation of the frequency control unit 42.

Figure 5:
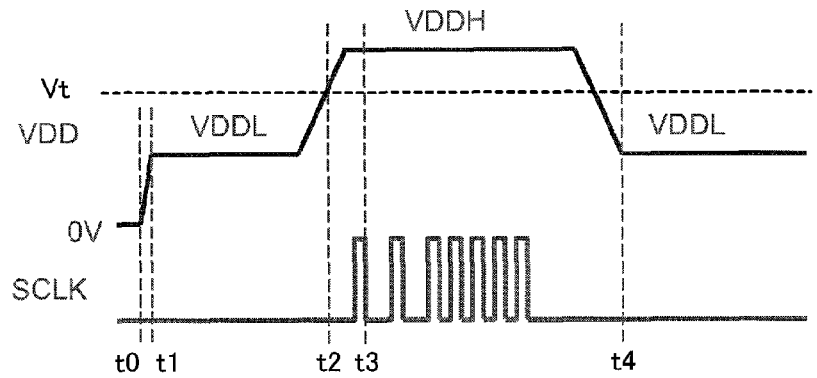
FIG. 5 is a timing chart for illustrating a mode switching operation of a control unit.

FIG. 5 is a timing chart for illustrating a mode switching operation of the control unit 30. In FIG. 5, a horizontal axis corresponds to time and a vertical axis corresponds to voltage. The timing chart at the upper portion of FIG. 5 indicates the power potential VDD supplied to the control unit 30, and the timing chart at the lower portion of FIG. 5 indicates the clock signal SCLK input to the control unit 30.

In the example shown in FIG. 5, the power potential VDD is 0 V at the time t0, a voltage VDDL at the time t1, and the reference value Vt at the time t2, and is increased to a voltage VDDH thereafter. The mode switching operation is started at the time t3 which is a time of increased pulse of the initial clock signal SCLK input in a period where the power potential VDD is the voltage VDDH higher than the reference value Vt, the first switching unit 21 and the second switching unit 22 are controlled to be the first mode, for example, based on the pulse of the clock signal SCLK thereafter, and the control unit 30 at the time t4 when the power potential VDD is returned to the voltage VDDL controls the first switching unit 21 and the second switching unit 22, and switches the mode to the second mode by controlling the first switching unit 21 and the second switching unit 22, for example.

According to the oscillation circuit 1 of the embodiment, since the control unit 30 performs switching of the mode based on the two signals of the magnitude of the power potential VDD and the clock signals SCLK, the mode is not switched by only the fluctuation of the power potential VDD, and accordingly, it is possible to reduce the possibility of the malfunction of unintentionally switching the mode.

In the case of the first mode, the control unit 30 may control the current source CS11 so as to stop the operation of the current source CS11 of the oscillation unit 10 or the oscillation unit 10a. Accordingly, it is possible to control the current supplied to the collector of the transistor M11 of the oscillation unit 10 or the oscillation unit 10a, and therefore it is possible to reduce the possibility of malfunction of the oscillation unit 10 or the oscillation unit 10a.

When the voltage input from the fourth terminal 14 exceeds the power current VDD, the second switching unit 22 preferably has an input tolerant function of preventing reverse flow of the current from the fourth terminal 14 to the fifth terminal 15. In the example shown in FIG. 1, at the time of the normal operation of the oscillation circuit 1, a signal for frequency control is input to the fourth terminal 14. Since a user of the oscillation circuit 1 sets the voltage of the signal for frequency control, a voltage higher than the power potential VDD may be erroneously input. Accordingly, the second switching unit 22 has an input tolerant function, and therefore it is possible to suppress negative influence on the fifth terminal 15.

Figure 6:
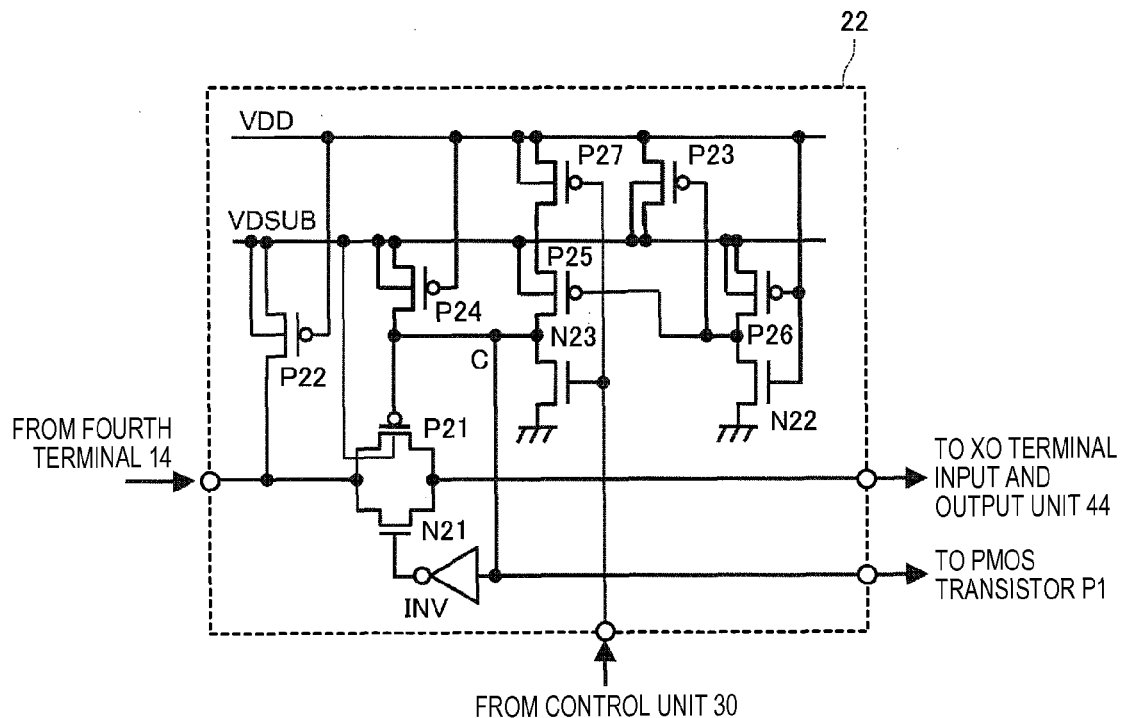
FIG. 6 is a circuit diagram showing a configuration example of a second switching unit having an input tolerant function.

FIG. 6 is a circuit diagram showing a configuration example of the second switching unit 22 having an input tolerant function. In the example shown in FIG. 6, the second switching unit 22 includes NMOS transistors N21 to N23, PMOS transistors P21 to P27, and an inverter INV. An analog switch is configured with the NMOS transistor N21 and the PMOS transistor P21.

In the first mode, a control signal output from the control unit 30 is at a high level. In this case, since a node C of FIG. 6 is at a low level, the analog switch configured with the NMOS transistor N21 and the PMOS transistor P21 is in a conductive state.

In the second mode, a control signal output from the control unit 30 is at a low level. In this case, since the node C of FIG. 6 is at a high level, the analog switch configured with the NMOS transistor N21 and the PMOS transistor P21 is in a state of being cutoff.

In the second mode, since the state of the PMOS transistor P23 is constantly ON, a node VDSUB and the power potential VDD have the same potential. When the potential of the fourth terminal 14 exceeds the power potential VDD, the charge is charged to the node VDSUB in a floating state due to a parasitic diode of the PMOS transistor P22, and the potential of the node VDSUB is gradually increased. The electrical current is applied to the PMOS transistor P22 when the potential of the node VDSUB becomes higher than the power potential VDD by an amount of a threshold voltage Vth of the PMOS transistor P22, and the node VDSUB and the fourth terminal 14 have the same potential. By doing so, electrical current is applied to the PMOS transistor P24 and the node C and the node VDSUB have the same potential, and the analog switch configured with the NMOS transistor N21 and the PMOS transistor P21 are maintained in a state of being cutoff. Accordingly, even when the potential of the fourth terminal 14 exceeds the power potential VDD, it is possible to electrically disconnect the fourth terminal 14 and an internal circuit (XO terminal input and output unit 44 in the example shown in FIG. 1 and FIG. 5) and to prevent an unintentional error, in the same manner as in a case where the potential of the fourth terminal 14 is equal to or less than the power potential VDD. In addition, even when the potential of the fourth terminal 14 exceeds the power potential VDD, it is possible to prevent reverse flow of the current from the fourth terminal 14 to the fifth terminal 15 without turning on a parasitic diode between the drain or the source terminal of the PMOS transistor P21 and a substrate potential.

2. Oscillation Circuit According to Second Embodiment

Figure 7:
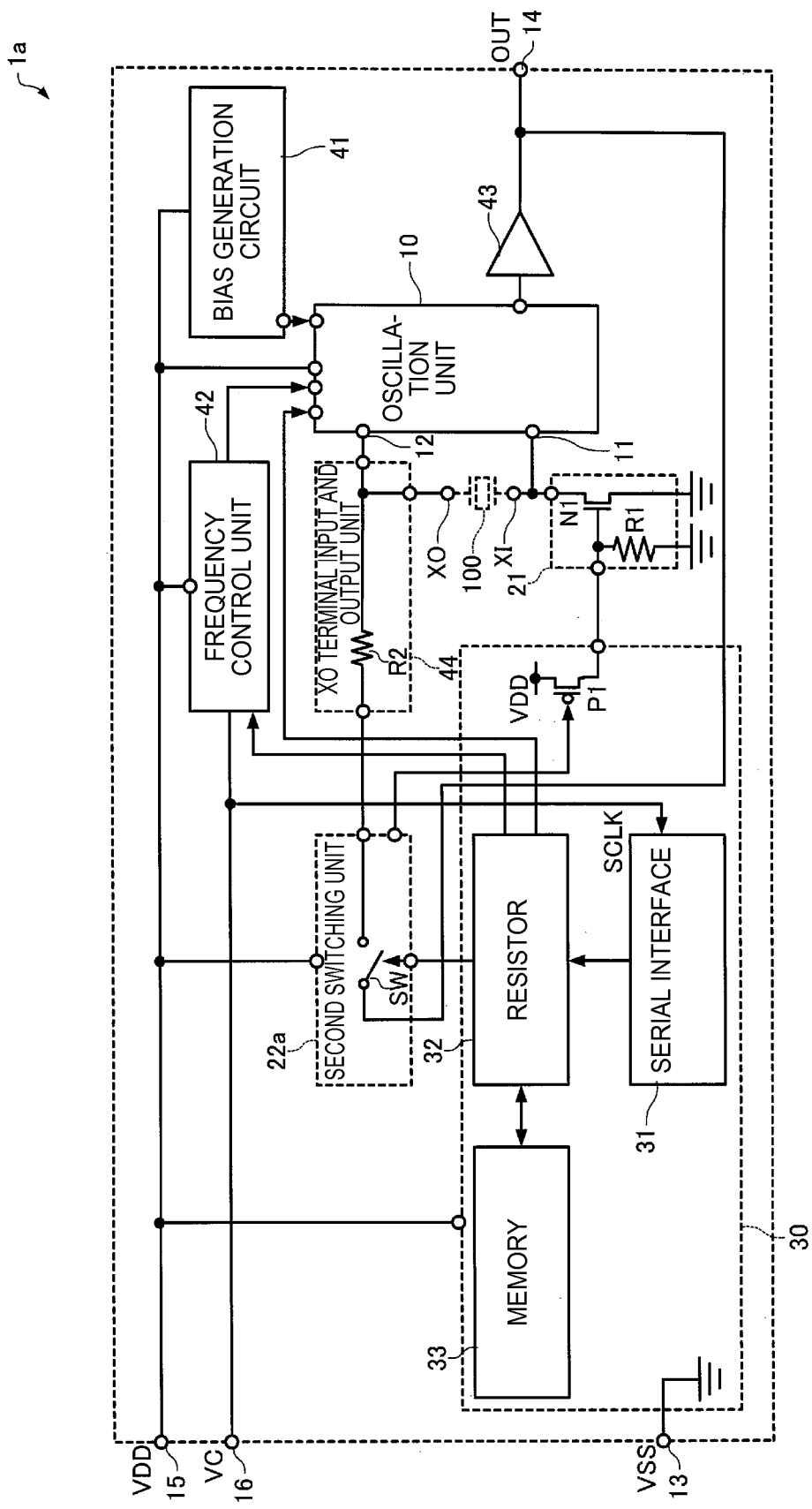
FIG. 7 is a circuit diagram of an oscillation circuit according to a second embodiment.

FIG. 7 is a circuit diagram of an oscillation circuit 1a according to a second embodiment. The same reference numerals are used for the same configuration as in the oscillation circuit 1 shown in FIG. 1, and specific description thereof will be omitted.

In the oscillation circuit 1*a* according to the embodiment, a terminal which also functions as a terminal to which an output signal of the output buffer 43 is output is set as the fourth terminal 14, and a terminal which also functions as a terminal for frequency control is set as the sixth terminal 16. The oscillation circuit 1*a* includes a second switching unit 22*a*, and the second switching unit 22*a* switches modes of electrical connection between the second terminal 12 and the fourth terminal 14.

Since the fourth terminal 14 of the oscillation circuit 1*a* is normally not a terminal to which a signal is normally input by a user, as the second switching unit 22*a*, a simple analog switch without an input tolerant function can be used. Accordingly, it is possible to reduce a circuit size. In addition, with the oscillation circuit 1*a*, the same effects as those of the oscillation circuit 1 according to the first embodiment are obtained for the same reasons.

3. Oscillation Circuit According to Third Embodiment

Figure 8:
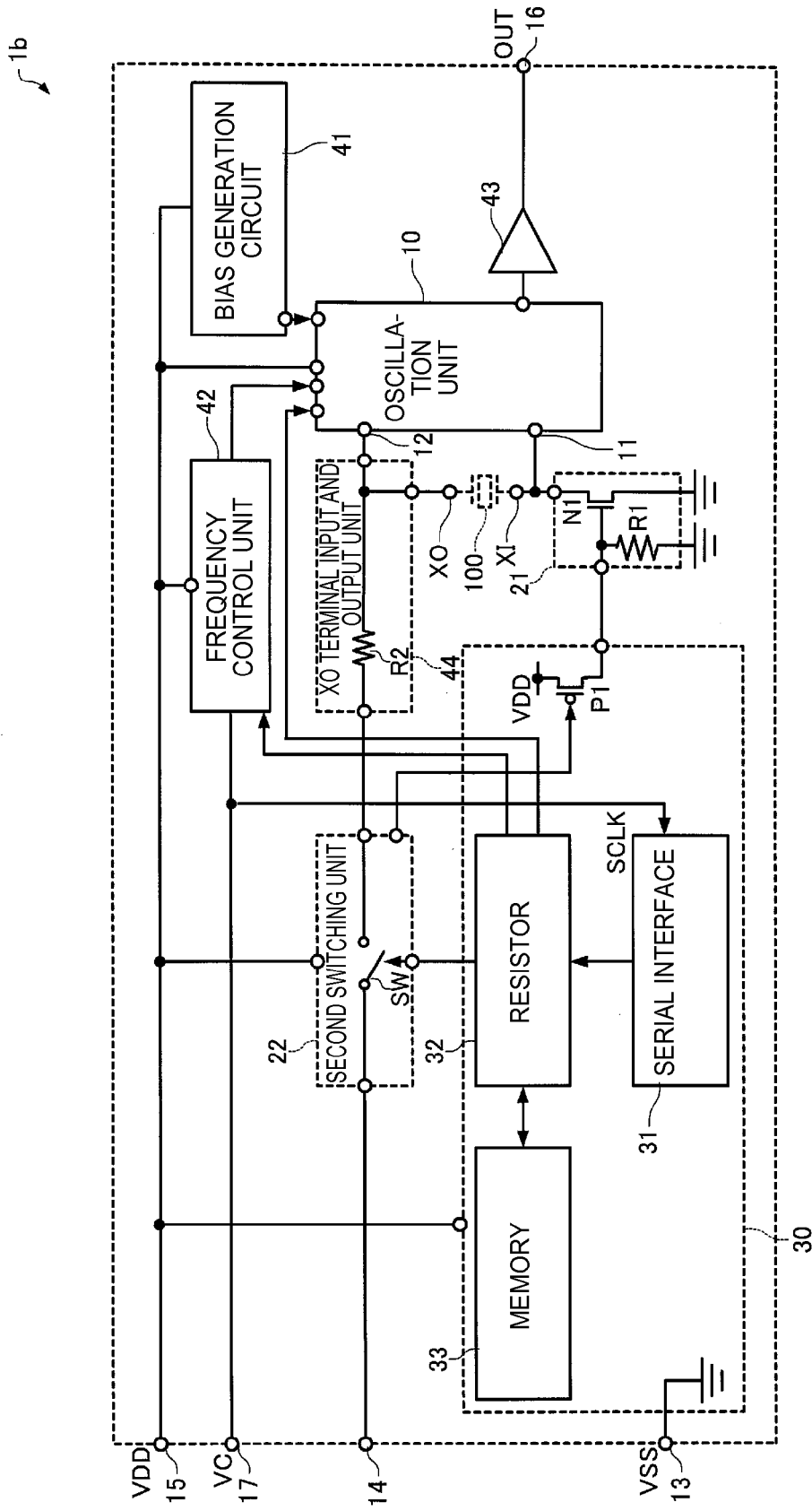
FIG. 8 is a circuit diagram of an oscillation circuit according to a third embodiment.

FIG. 8 is a circuit diagram of an oscillation circuit 1*b* according to a third embodiment. The same reference numerals are used for the same configuration as in the oscillation circuit 1 shown in FIG. 1, and specific description thereof will be omitted.

The oscillation circuit 1*b* according to the embodiment includes a seventh terminal 17 as a terminal for frequency control, and the fourth terminal 14 and the seventh terminal 17 are configured as independent terminals.

Even with the oscillation circuit 1*b*, the same effects as those of the oscillation circuit 1 are obtained for the same reasons. In addition, since the fourth terminal 14 and the seventh terminal 17 are configured to be independent, it is possible to omit the second switching unit 22. Accordingly, it is possible to reduce a circuit size.

4. Oscillator

Figure 9:
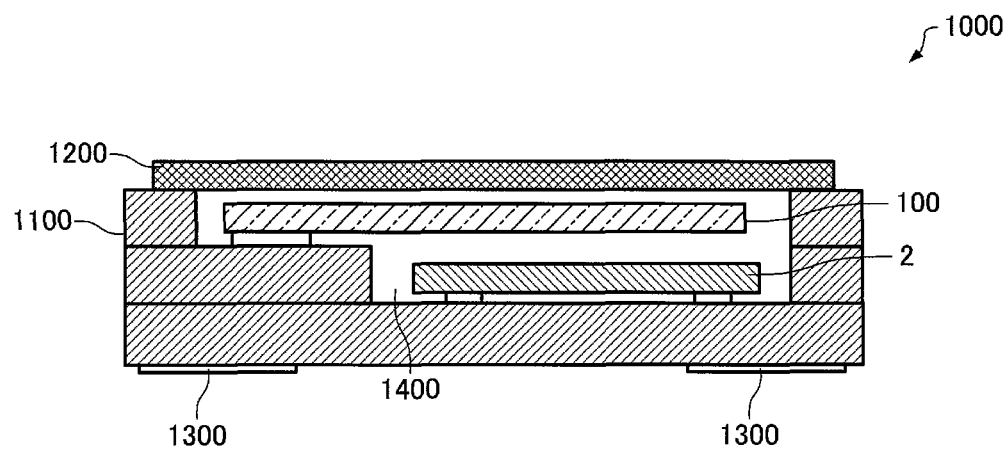
FIG. 9 is a cross-sectional view of an oscillator of the embodiment.

FIG. 9 is a cross-sectional view of an oscillator 1000 of the embodiment. The oscillator 1000 includes an electronic component 2 and the vibrator 100 configuring the oscillation circuit 1. In the example shown in FIG. 9, the oscillator 1000 includes a package 1100 which accommodates the electronic component 2 and the vibrator 100 in the same space. In the example shown in FIG. 9, the oscillator 1000 includes a cover 1200 and electrodes 1300. In the example shown in FIG. 9, the electronic component 2 is configured as a one-chip semiconductor device. In addition, as the vibrator 100, a crystal vibrator, a SAW resonator, a piezoelectric vibrator using piezoelectric ceramic, or a MEMS vibrator may be used.

A recess is provided in the package 1100, and an accommodation chamber 1400 is provided by covering the recess with the cover 1200. In the package 1100, wires and terminals for electrically connecting the oscillation circuit 1 and the vibrator 100 to each other are provided on the surface of the recess or in the package 1100. In addition, the electrodes 1300 electrically connected to the third terminal 13 (VSS), the fourth terminal 14 (VC), the fifth terminal 15 (VDD), and the sixth terminal 16 (OUT) of the oscillation circuit 1 are provided on the package 1100.

Figure 10:
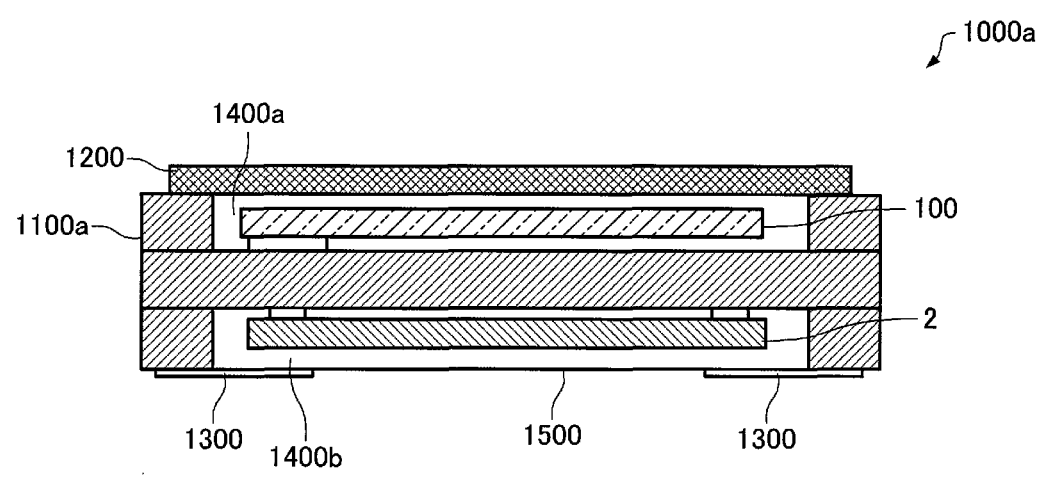
FIG. 10 is a cross-sectional view of an oscillator of a modification example.

FIG. 10 is a cross-sectional view of an oscillator 1000*a* of a modification example. The oscillator 1000*a* includes the electronic component 2 and the vibrator 100 configuring the oscillation circuit 1. In the example shown in FIG. 10, the oscillator 1000*a* includes a package 1100*a* which accommodates the electronic component 2 and the vibrator 100 in the same space. In the example shown in FIG. 10, the oscillator 1000*a* includes the cover 1200, the electrodes 1300 and a sealing member 1500. In the example shown in FIG. 10, the electronic component 2 is configured as one-chip semiconductor device. In addition, as the vibrator 100, a crystal vibrator, a SAW resonator, a piezoelectric vibrator using piezoelectric ceramics, or an MEMS vibrator may be used.

In the package 1100*a*, two recesses are provided on opposing surfaces, an accommodation chamber 1400*a* is provided by covering one of the recesses by the cover 1200, and an accommodation chamber 1400*b* is provided by covering one of the recesses with the sealing member 1500. In the example shown in FIG. 10, the vibrator 100 is accommodated in the accommodation chamber 1400*a*, and the electronic component 2 is accommodated in the accommodation chamber 1400*b*. In the package 1100*a*, wires and terminals for electrically connecting the oscillation circuit 1 and the vibrator 100 to each other are provided on the surface of the recesses or in the package 1100*a*. In addition, the electrodes 1300 electrically connected to the third terminal 13 (VSS), the fourth terminal 14 (VC), the fifth terminal 15 (VDD), and the sixth terminal 16 (OUT) of the oscillation circuit 1 are provided on the package 1100*a*.

According to the oscillator 1000 and the oscillator 1000*a* of the embodiment, since the oscillation circuit 1 with improved reliability in the inspection of the vibrator 100 is provided, it is possible to realize the oscillator 1000 and the oscillator 1000*a* with improved reliability in the inspection of the vibrator 100. The same effects described above are also obtained for the same reasons, even when oscillation circuit 1*a* or the oscillation circuit 1*b*, instead of the oscillation circuit 1, is used in the electronic component 2 configuring the oscillation circuit 1. Since the terminal dedicated to the inspection is commonly used with the terminal used at the time of the normal operation, it is possible to reduce the number of terminals and to miniaturize the oscillator 1000 and the oscillator 1000*a*.

5. Manufacturing Method of Oscillator

Figure 11:
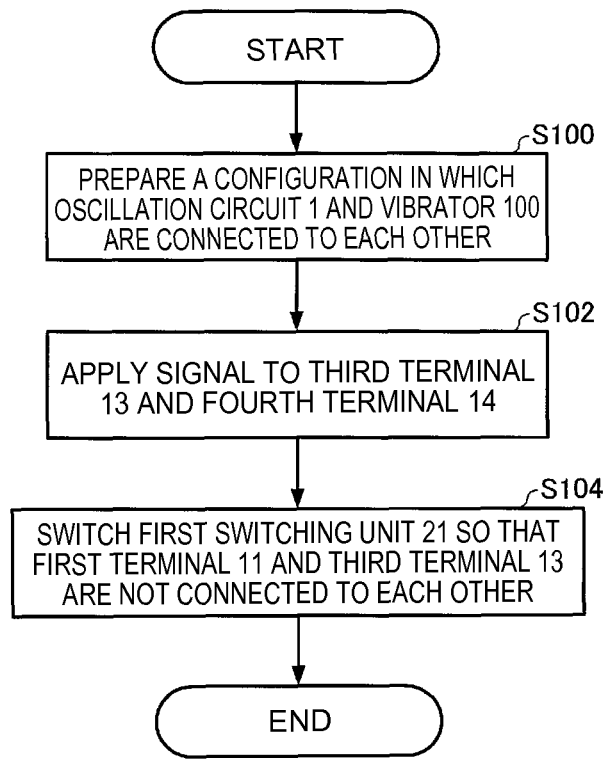
FIG. 11 is a flowchart showing a manufacturing method of an oscillator according to the embodiment.

FIG. 11 is a flowchart showing a manufacturing method of the oscillator 1000 according to the embodiment.

The manufacturing method of the oscillator 1000 according to the embodiment includes: preparing a configuration of including the oscillation circuit 1 including oscillation unit 10 which includes first terminal 11 and the second terminal 12 connected to the vibrator 100, the third terminal 13 connected to the ground potential VSS (predetermined potential), the fourth terminal 14 which is electrically connected to the second terminal 12, and the first switching unit 21 which switches modes of electrical connection between the first terminal 11 and the third terminal 13, and the vibrator 100, in which the oscillation circuit 1 and the vibrator 100 are electrically connected to each other, and the first switching unit 21 is switched so as to electrically connect the first terminal 11 and the third terminal 13 to each other; applying the AC voltage to the third terminal 13 and the fourth terminal 14; and switching the first switching unit 21 so as not to electrically connect the first terminal 11 and the third terminal 13 to each other.

First, a configuration in which the oscillation circuit 1 and the vibrator 100 are electrically connected to each other and the first switching unit 21 is switched so as to electrically connect the first terminal 11 and the third terminal 13 to each other (preparation step; step S100) is prepared. More specifically, a configuration in which the vibrator 100 is electrically connected between the first terminal 11 and the second terminal 12 of the oscillation circuit 1 is prepared. For example, the control unit 30 may set the mode of the first switching unit 21 to the first mode after connecting the oscillation circuit 1 to the vibrator 100, and the oscillation circuit 1 in which the mode of the first switching unit 21 is set to the first mode by the control unit 30 in advance may be connected to the vibrator 100.

After step S100, the AC voltage is applied to the third terminal 13 and the fourth terminal 14 (AC voltage applying step; step S102).

Figure 12:
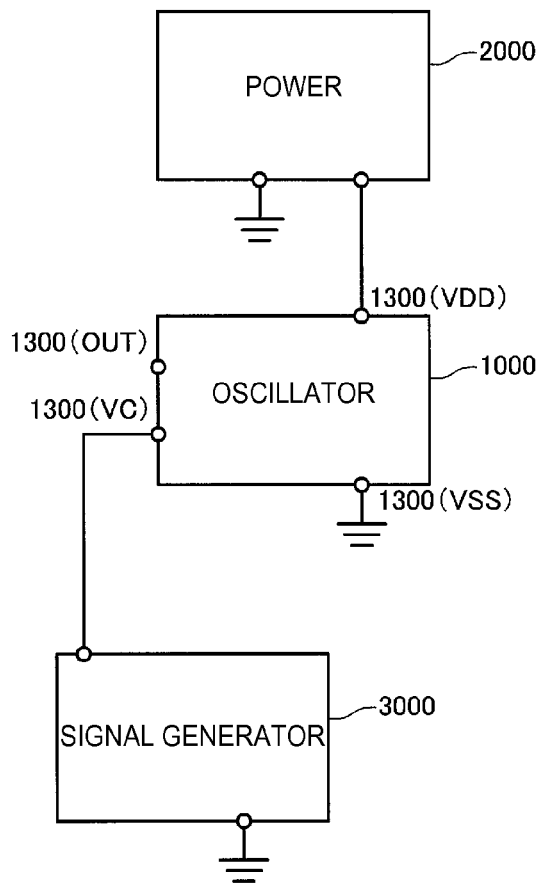
FIG. 12 is a block diagram showing an outline of a signal applying step.

FIG. 12 is a block diagram showing an outline of the AC voltage applying step. In the example shown in FIG. 12, the overdrive inspection of the vibrator 100 is performed by using a power 2000 and a signal generator 3000. The overdrive inspection of the vibrator 100 may be performed by using an externally-attached oscillation circuit which can be resonated with the vibrator 100, for example, a Colpitts oscillation circuit, instead of the signal generator 3000. The drive level inspection may be performed instead of the overdrive inspection, and the two inspections of the overdrive inspection and the drive level inspection may be performed.

The electrode 1300 (VDD) of the oscillator 1000 electrically connected to the fifth terminal 15 (VDD) of the oscillation circuit 1 is connected to a power supply terminal of the power 2000. The electrode 1300 (VSS) of the oscillator 1000 electrically connected to the third terminal 13 (VSS) of the oscillation circuit 1 is connected to the ground potential VSS. The electrode 1300 (VC) of the oscillator 1000 electrically connected to the fourth terminal 14 (VC) of the oscillation circuit 1 is connected to an output terminal of the signal generator 3000. The electrode 1300 (OUT) of the oscillator 1000 electrically connected to the sixth terminal 16 (OUT) of the oscillation circuit 1 is not connected to any of the elements.

With the configuration shown in FIG. 12, it is possible to apply the AC voltage between the third terminal 13 and the fourth terminal 14. Accordingly, it is possible to perform the inspection of the characteristics of the vibrator 100 such as overdrive inspection or drive level inspection.

After step S102, the first switching unit 21 is switched so that the first terminal 11 and the third terminal 13 are not electrically connected to each other (switching step; step S104). Specifically, the control unit 30 switches the mode of the first switching unit 21 to the second mode, for example. Accordingly, the oscillator 1000 can be constantly operated. In the manufacturing method described above, the oscillation circuit 1 has been described by using a configuration of including only the first switching unit 21, but there is no limitation thereof, and the oscillation circuit 1 which includes the second switching unit 22 which controls the electrical connection between the second terminal 12 and the fourth terminal 14 and switches the modes of the first switching unit 21 and the second switching unit 22 in association with each other may be used.

According to the manufacturing method of the oscillator 1000 of the embodiment, by supplying the voltage signal (one example of the AC voltage) for inspecting the vibrator 100 between the third terminal 13 and the fourth terminal 14 in the AC voltage applying step, it is possible to perform the inspection of the characteristics of the vibrator 100 such as overdrive inspection or drive level inspection. At the time of the normal operation of the oscillation circuit 1 and the inspection of the vibrator 100, the third terminal 13 can be commonly used, and accordingly it is possible to reduce the number of terminals used in the inspection, compared to a case of providing an inspecting terminal dedicated to the inspection. Thus, it is possible to reduce the possibility of an inspection malfunction due to a failure in the electrical connection between a probe for inputting an inspecting signal and a terminal on the oscillation circuit 1 side, and therefore, it is possible to realize the manufacturing method of the oscillator 1000 with improved reliability in the inspection of the vibrator 100.

In the manufacturing method of the oscillator 1000 described above, the signal applied to the third terminal 13 and the fourth terminal 14 in the signal applying step (step S102) may be at least one of the signal for overdrive inspection and the signal for drive level inspection.

According to the embodiment, since at least one of the overdrive inspection and the drive level inspection is performed as the inspection of the vibrator 100, it is possible to determine that the oscillator 1000 confirmed as a good product in the inspection of the vibrator 100, is a good product. Therefore, it is possible to manufacture the oscillator 1000 with high reliability.

The same effects described above are also obtained for the same reasons, even when oscillation circuit 1a or the oscillation circuit 1b is used instead of the oscillation circuit 1. In addition, it is also possible to manufacture the oscillator 1000a in the same manner as the oscillator 1000, and the same effects described above are obtained.

6. Electronic Device

Figure 13:
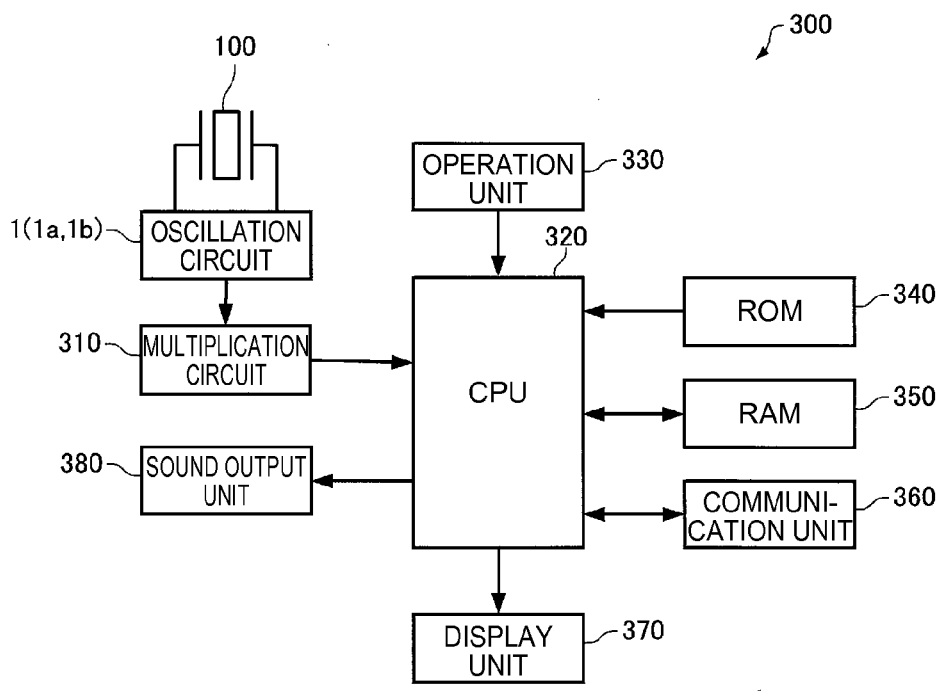
FIG. 13 is a functional block diagram of an electronic device according to the embodiment.

FIG. 13 is a functional block diagram of the electronic device 300 according to the embodiment. The same reference numerals are used for the same configuration as in the embodiments described above, and specific description thereof will be omitted.

An electronic device 300 according to the embodiment is the electronic device 300 including the oscillation circuit 1, the oscillation circuit 1a, the oscillation circuit 1b, the oscillator 1000, or the oscillator 1000a. FIG. 13 shows the electronic device 300 including the oscillation circuit 1. In the example shown in FIG. 13, the electronic device 300 includes the vibrator 100, the oscillation circuit 1, a multiplication circuit 310, a central processing unit (CPU) 320, an operation unit 330, a read only memory (ROM) 340, a random access memory (RAM) 350, a communication unit 360, a display unit 370, and a sound output unit 380. In the electronic device 300 according to the embodiment, some of the constituent elements (units) shown in FIG. 9 may be omitted or modified, and the other constituent elements may be added.

The multiplication circuit 310 supplies a clock pulse to not only the CPU 320 (not shown) but also to each unit. The clock pulse may be a signal which is obtained by extracting a desirable harmonic signal from an oscillation signal from the oscillation circuit 1 connected to the vibrator 100 by the multiplication circuit 310, or may be a signal obtained by multiplying the oscillation signal from the oscillation circuit 1 by the multiplication circuit 310 including a PLL synthesizer (not shown).

The CPU 320 performs various calculation processes or control processes by using the clock pulse output by the multiplication circuit 310, according to a program stored in the ROM 340 or the like. Specifically, the CPU 320 performs various processes according to an operation signal from the operation unit 330, a process of controlling the communication unit 360 for performing data communication with the outside, a process of transmitting a display signal for displaying various information items on the display unit 370, and a process of outputting various sounds to the sound output unit 380.

The operation unit 330 is an input device configured with an operation key or a button switch, and outputs the operation signal to the CPU 320 according to the operation performed by a user.

The ROM 340 stores a program or data allowing the CPU 320 to perform various calculation processes or control processes.

The RAM 350 is used as an operation area of the CPU 320, and temporarily stores a program or data read out from the ROM 340, data input from the operation unit 330, and an operation result executed according to various programs by the CPU 320.

The communication unit 360 performs various controls for satisfying data communication between the CPU 320 and an external device.

The display unit 370 is a display device configured with a liquid crystal display (LCD) or an electrophoretic display, and displays various information items based on a display signal input from the CPU 320.

The sound output unit 380 is a device such as a speaker which outputs sound.

According to the electronic device 300 of the embodiment, since the oscillation circuit 1, the oscillation circuit 1a, the oscillation circuit 1b, the oscillator 1000, or the oscillator 1000a with improved reliability in the inspection of the vibrator 100 are included, it is possible to realize the electronic device 300 with high reliability.

Various electronic devices are considered as the electronic device 300. For example, a personal computer (for example, a mobile-type personal computer, a laptop-type personal computer, or a tablet-type personal computer), a moving object terminal such as a mobile phone, a digital still camera, an ink jet type discharging apparatus (for example, ink jet printer), a storage area network apparatus such as a router or a switch, a local area network apparatus, an apparatus for moving object terminal base station, a television, a video camera, a video recorder, a car navigation apparatus, a pager, an electronic organizer (including a communication function), an electronic dictionary, a calculator, an electronic game device, a game controller, a word processor, a work station, a video phone, a security monitor, electronic binoculars, a POS (point of sale) terminal, medical equipment (for example, an electronic thermometer, a blood pressure meter, a blood glucose meter, an ECG measuring device, a ultrasound diagnostic device, an electronic endoscope), a fishfinder, a variety of measurement equipments, a meter (for example, meters for vehicles, aircraft, ships), a flight simulator, a head mounted display, motion tracing, motion tracking, a motion controller, PDR (pedestrian position and azimuth measurement), and the like.

Figure 14:
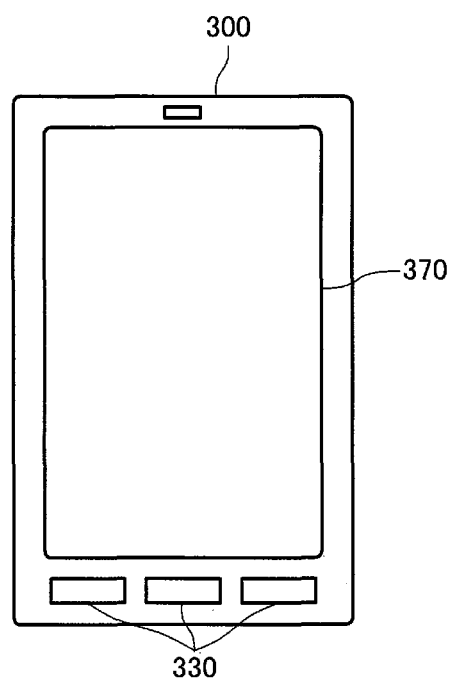
FIG. 14 is a diagram showing an example of the appearance of a smart phone which is an example of an electronic device.

FIG. 14 is a diagram showing an example of the appearance of a smart phone which is an example of the electronic device 300. The smart phone which is the electronic device 300 includes buttons as the operation unit 330 and an LCD as the display unit 370. Since the smart phone which is the electronic device 300 includes the oscillation circuit 1, the oscillation circuit 1a, the oscillation circuit 1b, the oscillator 1000, or the oscillator 1000a, it is possible to realize the electronic device 300 with high reliability.

7. Moving Object

Figure 15:
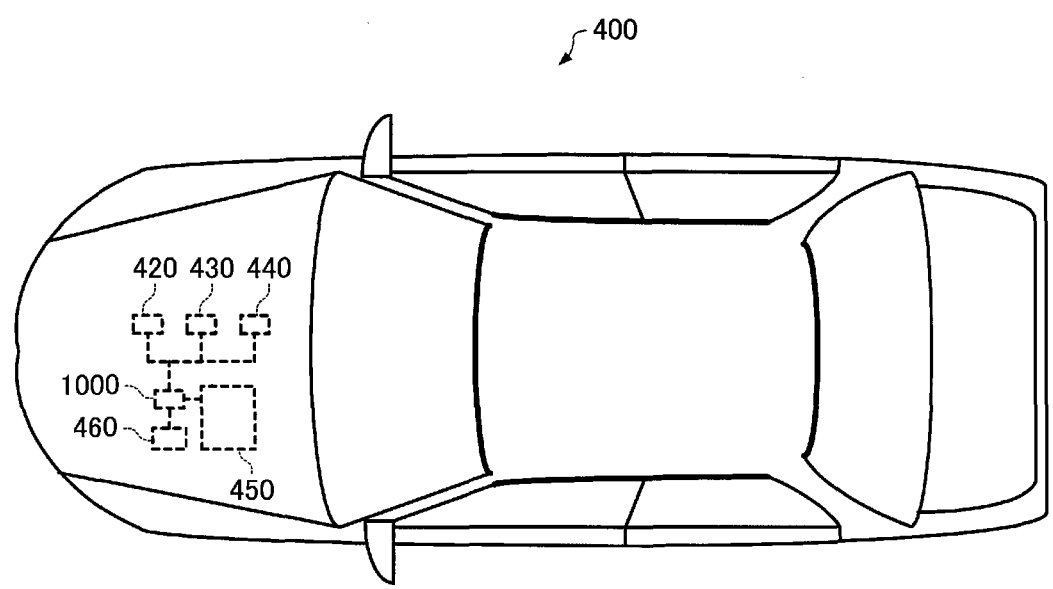
FIG. 15 is a diagram (top view) showing an example of a moving object according to the embodiment.

FIG. 15 is a diagram (top view) showing an example of a moving object 400 according to the embodiment. The same reference numerals are used for the same configuration as in the embodiments described above, and specific description thereof will be omitted.

The moving object 400 according to the embodiment is a moving object including the oscillation circuit 1, the oscillation circuit 1a, the oscillation circuit 1b, the oscillator 1000, or the oscillator 1000a. FIG. 15 shows the moving object 400 including the oscillator 1000. In the example shown in FIG. 15, the moving object 400 includes a controller 420, a controller 430, and a controller 440 which performs various controls of an engine system, a brake system, and a keyless entry system, and a battery 450, and a backup battery 460. In the moving object 400 according to the embodiment, a part of the constituent elements (units) shown in FIG. 15 may be omitted or modified, and other constituent elements may be added.

According to the moving object 400 of the embodiment, since the oscillation circuit 1, the oscillation circuit 1a, the oscillation circuit 1b, the oscillator 1000, or the oscillator 1000a with improved reliability in the inspection of the vibrator 100 are included, it is possible to realize the moving object 400 with high reliability.

Various moving objects are considered as the moving object 400, for example a vehicle (including an electric vehicle), an aircraft such as a jet or a helicopter, a ship, a rocket, or a satellite.

The embodiments or modification examples have been described, but the invention is not limited to the embodiments or modification examples, and the invention can be realized with various embodiments within a range not departing from a scope thereof.

The invention includes substantially the same configuration as the configuration described in the embodiments (for example, a configuration having the same functions, methods, and results, or a configuration having the same object and effects). The invention includes a configuration obtained by replacing the non-essential parts of the configuration described in the embodiments. The invention includes a configuration for realizing the same operation effects or a configuration for reaching the same object as the configuration described in the embodiments. The invention includes a configuration obtained by adding the related art to the configuration described in the embodiments.

The entire disclosure of Japanese Patent Application No. 2013-225998 filed Oct. 30, 2013 is expressly incorporated by reference herein.

What is claimed is:

1. An oscillation circuit comprising:
   an oscillation unit which includes a first terminal and a second terminal connected to a vibrator;
   a third terminal which is connected to a power potential having a predetermined potential;
   a fourth terminal which is electrically connected to the second terminal;
   a first switching unit which switches modes of electrical connection between the first terminal and the third terminal; and
   a control unit that controls modes of the first switching unit, wherein:
   the fourth terminal receives at least one of an AC voltage for driving the vibrator and a voltage for operating the oscillation unit,
   the first switching unit includes:
      a first mode in which the first terminal and the third terminal are electrically coupled, and
      a second mode in which the first terminal and the third terminal are electrically uncoupled to each other, and the control unit switches the first switching unit from the second mode to the first mode based on a clock signal input in a period in which the power potential being supplied is equal to or greater than a reference value.

2. The oscillation circuit according to claim 1,
wherein the predetermined potential is a ground potential.

3. The oscillation circuit according to claim 1,
wherein the first switching unit is a circuit adapted to prevent the oscillation unit from receiving a voltage higher than a maximum voltage applied to the first terminal while the oscillation unit is operated.

4. The oscillation circuit according to claim 1,
wherein the first terminal is an input terminal of the oscillation unit.

5. The oscillation circuit according to claim 1,
wherein the first switching unit includes a transistor.

6. The oscillation circuit according to claim 1,
wherein the fourth terminal is not any one of:
   a power terminal to which a power potential is supplied,
   a ground terminal which is connected to a ground potential, and
   an oscillation terminal to which an oscillation signal of the oscillation circuit is output.

7. The oscillation circuit according to claim 1, further comprising:
   a second switching unit which switches modes of electrical connection between the second terminal and the fourth terminal.

8. The oscillation circuit according to claim 1, further comprising:
   a second switching unit which switches modes of electrical connection between the second terminal and the fourth terminal wherein:
   the second switching unit includes:
      a first mode in which the second terminal and the fourth terminal are electrically connected to each other, and
      a second mode in which the second terminal and the fourth terminal are not electrically connected to each other, and
   the control unit controls the second switching unit and switches the mode of the first switching unit and the second switching unit from the second modes to the first modes based on the clock signal input in the period in which the power potential being supplied is equal to or greater than the reference value.

9. An oscillator comprising:
the oscillation circuit according to claim 1; and
a vibrator.

10. The oscillator according to claim 9, further comprising:
   a package which accommodates both the oscillation circuit and the vibrator.

11. A manufacturing method of an oscillator, comprising:
preparing an assembly having:
   an oscillation circuit including:
      an oscillation unit which includes a first terminal and a second terminal connected to a vibrator,
      a third terminal which is connected to a predetermined potential,
      a fourth terminal which is electrically connected to the second terminal, and
      a first switching unit which switches modes of electrical connection between the first terminal and the third terminal,
   a control unit that switches the first switching unit from a second mode to a first mode based on a clock signal input in a period in which the predetermined potential being supplied is equal to or greater than a reference value; and
   a vibrator electrically connected to the oscillation circuit,
causing the first switching unit to electrically connect the first terminal and the third terminal to each other in the first mode;
applying an AC voltage to the third terminal and the fourth terminal; and
switching the first switching unit so as to electrically disconnect the first terminal and the third terminal from each other in the second mode.

12. The manufacturing method of an oscillator according to claim 11,
wherein the AC voltage applied to the third terminal and the fourth terminal is at least one of a voltage for overdrive inspection and a voltage for drive level inspection.

13. An electronic device comprising the oscillation circuit according to claim 1.

14. A moving object comprising the oscillation circuit according to claim 1.

* * * * *

UNITED STATES PATENT AND TRADEMARK OFFICE
CERTIFICATE OF CORRECTION

PATENT NO. : 9,461,585 B2
APPLICATION NO. : 14/525568
DATED : October 4, 2016
INVENTOR(S) : Takehiro Yamamoto et al.

Page 1 of 1

It is certified that error appears in the above-identified patent and that said Letters Patent is hereby corrected as shown below:

On the Title Page

Column 1, Item (72) Inventors:, Line 4, please add --Akihiro FUKUZAWA--.

Signed and Sealed this
Ninth Day of April, 2019

Andrei Iancu
*Director of the United States Patent and Trademark Office*